(12) United States Patent
Lutwak et al.

(10) Patent No.: US 11,764,796 B2
(45) Date of Patent: Sep. 19, 2023

(54) VAPOR CELLS AND RELATED SYSTEMS AND METHODS

(71) Applicant: Microchip Technology Incorporated, Chandler, AZ (US)

(72) Inventors: Robert Lutwak, Marblehead, MA (US); Bomy Chen, Newark, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/678,655

(22) Filed: Feb. 23, 2022

(65) Prior Publication Data
US 2023/0143437 A1 May 11, 2023

Related U.S. Application Data

(60) Provisional application No. 63/263,897, filed on Nov. 11, 2021.

(51) Int. Cl.
*G04F 5/14* (2006.01)
*H03L 7/26* (2006.01)

(52) U.S. Cl.
CPC .................................. *H03L 7/26* (2013.01)

(58) Field of Classification Search
CPC .......................................... G04F 5/14
USPC .......................................... 331/94.1
See application file for complete search history.

(56) References Cited

U.S. PATENT DOCUMENTS

| | | | |
|---|---|---|---|
| 4,495,478 A | 1/1985 | Kwon et al. | |
| 5,441,575 A | 8/1995 | Underwood et al. | |
| 5,533,393 A | 7/1996 | Bonne et al. | |
| 6,495,479 B1 | 12/2002 | Wu et al. | |
| 9,491,802 B2 | 11/2016 | Strabley et al. | |
| 9,763,314 B1 | 9/2017 | Roper et al. | |
| 9,766,593 B2 | 9/2017 | Burt et al. | |
| 10,461,760 B2 | 10/2019 | Gobet et al. | |
| 10,749,539 B2 | 8/2020 | Kriz et al. | |
| 10,823,668 B2 | 11/2020 | Nelson et al. | |
| 10,828,618 B1 | 11/2020 | Roper et al. | |
| 11,043,349 B1 | 6/2021 | Roper | |

(Continued)

FOREIGN PATENT DOCUMENTS

| | | |
|---|---|---|
| EP | 2629159 B1 | 8/2013 |
| EP | 3477275 A1 | 10/2017 |
| EP | 3244269 A1 | 11/2017 |

OTHER PUBLICATIONS

Hirai et al., "Low Temperature Wafer-Level Process of Alkali-Metal Vapor Cells for Micro-Fabricated Atomic Clocks", 2017 19th International Conference on Solid-State Sensors, Actuators and Microsystems (Transducers), IEEE, (Jun. 18, 2017) pp. 431-434.

(Continued)

*Primary Examiner* — Joseph Chang
(74) *Attorney, Agent, or Firm* — TraskBritt

(57) ABSTRACT

Vapor cells may include a body including a cavity within the body. A first substrate bonded to a second substrate at an interface within the body, at least one of the first substrate, the second substrate, or an interfacial material between the first and second substrates may define at least one recess or pore in a surface. A smallest dimension of the at least one recess or pore may be about 500 microns or less, as measured in a direction parallel to at least one surface of the first substrate partially defining the cavity.

23 Claims, 10 Drawing Sheets

(56) References Cited

U.S. PATENT DOCUMENTS

| | | |
|---|---|---|
| 11,101,809 B1 | 8/2021 | Roper |
| 11,142,651 B1 | 10/2021 | Roper et al. |
| 2005/0007118 A1* | 1/2005 | Kitching .................. H03L 7/26 |
| | | 324/464 |
| 2013/0213940 A1* | 8/2013 | Strabley .................. C23C 14/16 |
| | | 219/50 |
| 2015/0226669 A1 | 8/2015 | Compton |
| 2015/0270843 A1 | 9/2015 | Nakajima et al. |
| 2015/0372686 A1 | 12/2015 | Parsa et al. |
| 2016/0294402 A1 | 10/2016 | Dyer et al. |
| 2017/0315044 A1 | 11/2017 | Krishnan |
| 2017/0331485 A1* | 11/2017 | Gobet ....................... G04F 5/14 |
| 2018/0003778 A1 | 1/2018 | Miyazawa |
| 2018/0210403 A1* | 7/2018 | Maurice .................... H03L 7/26 |
| 2019/0077656 A1 | 3/2019 | Cook et al. |
| 2019/0323952 A1 | 10/2019 | Nelson et al. |
| 2021/0208542 A1 | 7/2021 | Maurice et al. |

OTHER PUBLICATIONS

International Search Report for International Application No. PCT/US2022/017521, dated Jul. 25, 2022, 6 pages.

International Written Opinion for International Application No. PCT/US2022/017521, dated Jul. 25, 2022, 7 pages.

Liew et al., "Microfabricated Alkali Atom Vapor Cells", Applied Physics Letters, vol. 84, No. 14, (Apr. 5, 2007) pp. 2694-2696.

\* cited by examiner

VAPOR CELLS AND RELATED SYSTEMS AND METHODS

CROSS-REFERENCE TO RELATED APPLICATION

This application claims the benefit under 35 U.S.C. § 119(e) of the priority date of U.S. Provisional Patent Application Ser. No. 63/263,897, filed Nov. 11, 2021, for EMPLOYING PORES FOR CONTROLLING VAPOR PRESSURE IN VAPOR CELLS, AND RELATED VAPOR CELLS, SYSTEMS, AND METHODS, the disclosure of which is incorporated herein in its entirety by this reference.

STATEMENT REGARDING FEDERALLY SPONSORED RESEARCH OR DEVELOPMENT

This invention was made with government support under W911NF2120016 awarded by U.S. Army Research Laboratory. The government has certain rights in the invention.

FIELD

This disclosure relates generally to techniques for controlling vapor pressure of subject materials in vapor cells for atomic clocks and other applications. More specifically, disclosed examples relate to structures and materials for controlling vapor pressure, which may improve reliability of operation across broader temperature ranges.

BACKGROUND

Vapor pressure at a liquid-vapor interface is affected by surface tension according to the Kelvin equation:

$$\frac{P}{P_{sat}} = e^{2\gamma V_m / rRT},$$

where $P/P_{sat}$ is the ratio of the vapor pressure to the saturated vapor pressure, $\gamma$ is the surface tension, $V_m$ is the molar volume of the liquid, $r$ is the radius of the droplet or meniscus, $R$ is the universal gas constant, and $T$ is the absolute temperature. Vapor pressure is relevant in a variety of operational contexts, including, without limitation, atomic clocks.

BRIEF SUMMARY

In some examples, vapor cells may include a body defining a cavity within the body. A first substrate may be bonded to a second substrate at an interface. At least one of the first substrate, the second substrate, or an interfacial material between the first substrate and the second substrate may define at least one recess or pore. The at least one recess or pore may have a smallest dimension of about 500 microns or less, as measured in a direction parallel to at least one surface of the first substrate partially defining the cavity.

In other examples, methods of using vapor cells may involve providing a vapor cell including a body. The body may include a first substrate bonded to a second substrate at an interface. A cavity may be defined within the body. At least one pore or recess may be formed in at least one of the first substrate, the second substrate, or an interfacial material between the first substrate and the second substrate. The at least one pore or recess may have a smallest dimension of about 500 microns or less, as measured in a direction parallel to at least one surface of the first substrate partially defining the cavity.

In other embodiments, a system may include an emitter positioned and oriented to direct radiation through windows of a vapor cell. The system may include a detector positioned and oriented to detect the radiation. The vapor cell may include a body defining a cavity within the body. The body may include a first substrate, a second substrate, or an interfacial material between the first substrate and the second substrate. The first substrate, the second substrate, or the interfacial material between the first substrate and the second substrate may define at least one pore or recess having a smallest dimension of about 500 microns or less, as measured in a direction parallel to at least one surface of the first substrate partially defining the cavity.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

DETAILED DESCRIPTION

Figure 1A:
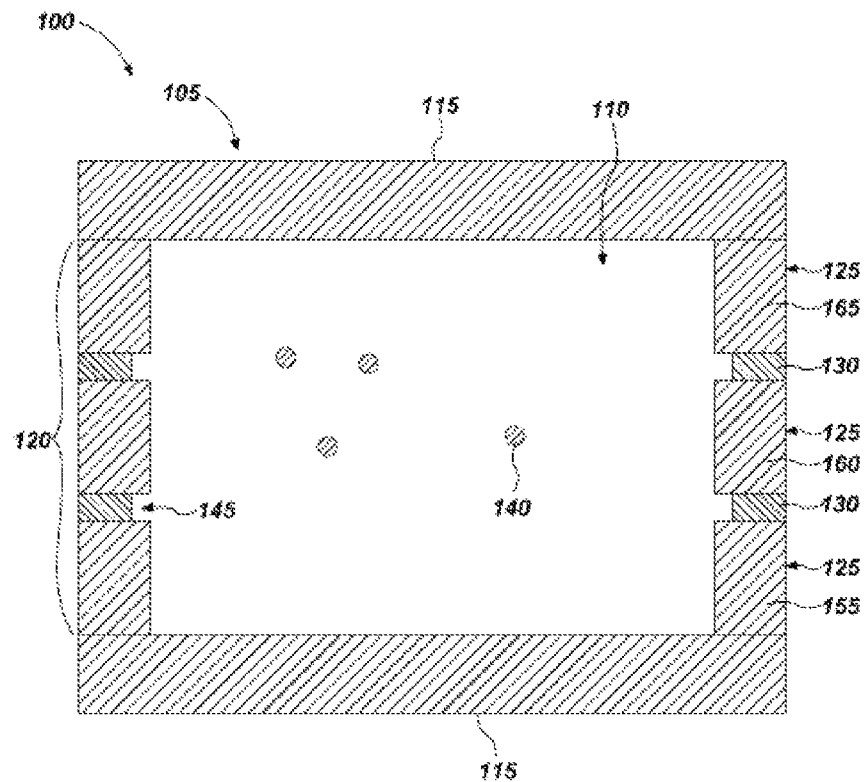
FIGS. 1A and 1B are schematic cross-sectional side views of examples of vapor cells.

Disclosed examples relate generally to designs for structural features that allow for control of vapor pressure in vapor cells for, as a nonlimiting example, atomic clocks. Such designs and structural features may, as a nonlimiting example, increase the temperature range over which reliable operation may be achieved. More specifically, disclosed examples relate to structures and methods for forming recesses and or pores in vapor cells for controlling (e.g., suppressing) vapor pressure. For example, at least one surface in a vapor cell may include one or more recesses or pores sized, shaped, positioned, and configured to control (e.g., suppress) vapor pressure of a subject material in the vapor cell. The recess or recesses may be formed by, for example, selectively etching certain material of a stacked structure of a portion of a body of the vapor cell, thereby recessing certain portions of the stacked structure relative to other portions of the stacked structure to form one or more recesses. As another illustrative technique for forming the pore or pores, a material of a portion of a substrate, or the material of portions of multiple substrates in a stacked structure forming a portion of a body of the vapor cell, may be rendered porous, and certain portions of the porous material and of any relevant non-porous material may be removed to form a portion of a cavity of the vapor cell, and the substrate or substrates may be oriented, stacked, and bonded to one another to form at least a portion of the body of the vapor cell with the porous material exposed to, and placed in a predetermined location relative to, the cavity. Disclosed methods of controlling vapor pressure may provide volumes of capillaries for holding subject material in a liquid state therein and for inducing an exposed surface of the subject material in the liquid state to be concave.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The term "pore," as used herein, means and includes surface features having an average dimension less than 500 microns, as measured in at least one direction parallel to a major surface defining a cavity to which the pore is exposed. For example, "pores" include interconnected, three-dimensional networks of voids within a material that may be occupied by environmental fluids (e.g., air, inert gas, subject material). "Pores" also include, for example, depressions, divots, dimples, and other surface features having average dimensions less than 500 microns, which may be measurable as surface roughness.

The term "interface" as used herein, means and includes a point or region of attachment between two materials or structures. For example, an "interface" may include direct contact between two adjacent surfaces, or may include an interfacial material interposed between, and attaching, two adjacent surfaces on opposite sides of the interfacial material.

Unless the context indicates otherwise, removal of materials or surface modifications described herein may be accomplished by any suitable technique including, but not limited to, etching (e.g., dry etching, wet etching, vapor etching, reactive ion etching, stain etching), ion milling, abrasive planarization (e.g., chemical-mechanical planarization (CMP)), anodization, or other known methods.

The upper operating temperature limit of vapor-cell atomic clocks, such as chip scale atomic clocks (CSACs), without limitation, may be limited by excessive optical absorption, collisional line broadening, and/or heating of a trapped sample due to the high density of alkali metal vapor at elevated temperatures. The vapor pressure above a liquid may be suppressed by containing the liquid within a recess, recesses, pore, or pores. Such structures may enable depressing the alkali metal vapor pressure. In accordance with the Kelvin equation mentioned above, if the curvature of a droplet of subject liquid is convex, r>0, then $P > P_{sat}$. If the curvature is concave, r<0, then $P < P_{sat}$. Maintaining control over the vapor pressure of the metal vapor requires the holding capacity (e.g., volume) of the pores to be equal to or greater than a volume required to hold a mass of the metal vapor in a liquid or solid state.

Reducing subject material vapor pressure within vapor cells of atomic clocks may be achieved by introducing at least one recess or pore that affects the surface shape of masses of the subject material in the pores. Stated another way, the interaction between the subject material and the size and shape of a pore causes a shape of a surface of the subject material to change in a desired manner (introduces a disturbance) as compared to a shape of the surface of the subject material when on a generally flat surface.

When forming vapor cells, top and bottom windows may be bonded to opposite surfaces of a remainder of a body of the vapor cell having cavities formed in the remainder, each cavity corresponding to a respective vapor cell to be singulated from a wafer. The cavities may be formed, by way of example, by etching or micromachining through a material of the remainder of the body of the vapor cell (e.g., a substrate, a wafer, a stacked structure). By way of example, the geometry of a cylindrical cavity may be described by height and diameter, wherein the height of the cavity may be defined as the distance from the at least one window to another window located at an opposite side of the cavity, and the diameter of the cavity may be defined as the distance between sidewalls defining the cavity, as measured in a direction perpendicular to the sidewalls and along a line intersecting a central geometric axis of the cavity. The height and diameter of the cavity may be used to describe geometric differences along the sidewalls of the cavity of the vapor cell. In other examples, the cavity may have a shape other than cylindrical (e.g., ovoid, rectangular prism, rectangular prism having one or more rounded and/or chamfered edges and/or corners). A subject material may be introduced into the cavity of each vapor cell, and the cavities may be enclosed to contain the subject material. For example, each cavity may be enclosed using anodic bonding to bond the top and bottom windows to major surfaces of the remainder of a body of the vapor cell. In embodiments where the body of the vapor cell comprises a wafer or stacked wafers, individual vapor cells may be diced from the wafer or stacked wafers.

In one or more examples, surface modification may include generation of one or more recesses in the walls of a body of a vapor cell, with the recesses partially defining a cavity of the vapor cell. By way of example, a recess may be formed by bonding two wafers or substrate with an interfacial material therebetween and subsequently removing a portion of the interfacial material to form a recess cooperatively defined by the adjacent substrates and the interfacial material. As a specific example, an oxide layer may be grown on a first silicon wafer, and a second silicon wafer may be surface bonded to the first silicon wafer with the oxide layer therebetween. Holes to define sidewalls of the vapor cell cavities may be formed through the first and second wafers and the oxide layer, either before or after bonding, by, for example, masking and etching, drilling, selectively growing the oxide layer only on those portions of the wafers that will not be removed to form the cavities, or performing any combination of these. The recess may then be formed by selectively etching the oxide layer, forming a recess with a depth controlled by the time of exposure to the etchant material (e.g., HF etching) and a height controlled by the growth of the oxide layer. In some examples, the body of the vapor cell may include more than two bonded substrates, such as, for example, by stacking three or more wafers bonded together with an interfacial material between each pair of wafers, and a series of recesses, one for each interfacial material.

By way of additional example, recesses may be formed by providing a substrate or wafer with alternating regions of oxide material between regions of non-oxide material, the oxide material being recessed relative to the non-oxide material to form a recess. This may be accomplished by, for example, alternately growing the oxide and non-oxide materials on a wafer. For example, silicon oxide may be alternately grown with silicon nitride or polysilicon materials on a silicon wafer through epitaxy, providing selective control of the height of the pores to be formed by partial removal of the regions of oxide material. Two at least substantially complementary wafers or substrates having the alternating regions of oxide and non-oxide materials facing one another may be bonded to one another by surface bonding techniques. Cavities may be formed by, for example, drilling and/or etching the wafers or substrates and the alternating regions of oxide and non-oxide materials. Recesses in the cavities may be formed utilizing, for example, a selective etch (e.g., HF etch) to remove portions of the oxide material while leaving the non-oxide material, providing selective control over the depth of the recesses. Recesses, as disclosed herein, may also be characterized as "trenches."

Figure 1B:
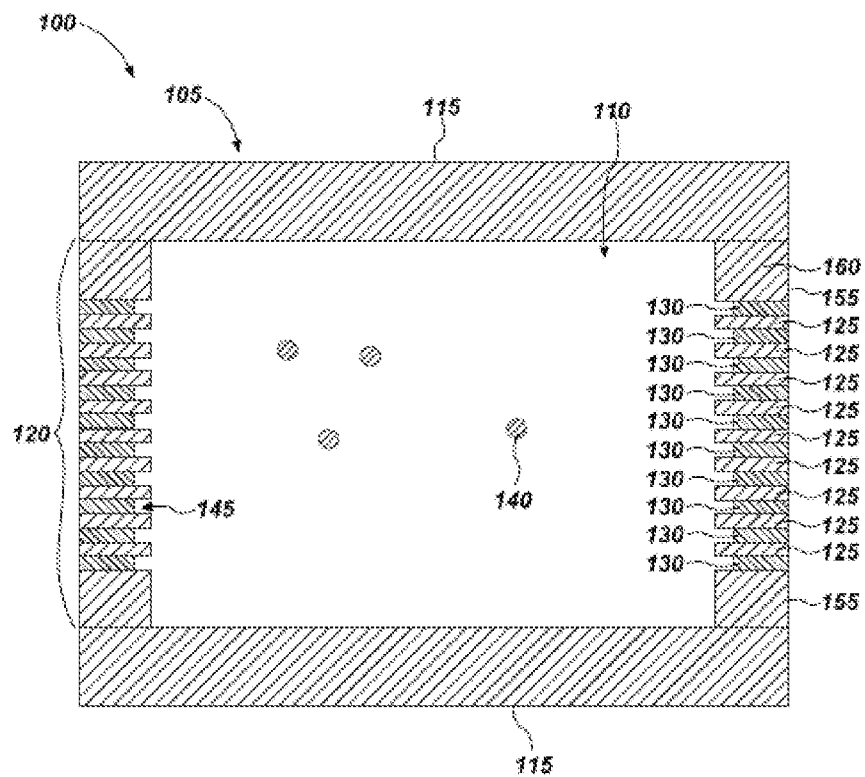

FIGS. 1A and 1B are schematic cross-sectional side views of examples of vapor cells 100. Each vapor cell 100 may include, for example, a body 105 which contains a cavity 110. For example, the body 105 may include windows 115 forming one or more walls (e.g., boundaries) of the body 105, with the remaining sidewalls 120 being opaque. More specifically, the windows 115 may include, for example, a transparent or translucent borosilicate or aluminosilicate glass material, enabling the cavity 110 of the vapor cell 100 to be viewable through each of the windows 115.

The body 105 defining the cavity 110 within the body 105 may include a first substrate 155 bonded to a second substrate 160 at an interface, which may be defined by an interfacial material 130 interposed between the first substrate 155 and the second substrate 160. At least one of the first substrate 155, the second substrate 160, or the interfacial material 130 may define at least one recess 145 having a smallest dimension of 500 microns or less. For example, a surface of the interfacial material 130 facing the cavity 110 may be recessed relative to surfaces of the first substrate 155 and the second substrate 160 facing the cavity 110, such that the first substrate 155, second substrate 160, and interfacial material 130 may cooperatively define a recess 145. The recess 145 may include, for example, an annular recess extending around a circumference of the body 105 and exposed to a remainder of the cavity 110. The interfacial material 130 may include an oxide material interposed between, and bonded to, the first substrate 155 and the second substrate 160. The body 105 may include a stack of substrates including at least the first substrate 155 and the second substrate 160 and a respective mass of the interfacial material 130 interposed between each pair of substrates of the stack of substrates. For example, the body 105 may include the first substrate 155, the second substrate 160 adjacent to the first substrate 155, and a third substrate 165 located on a side of the second substrate 160 opposite the first substrate 155, with a mass of the interfacial material 130 between the first substrate 155 and the second substrate 160 and another mass of the interfacial material 130 between the second substrate 160 and the third substrate 165. Each respective mass of the interfacial material 130 may be recessed relative to each pair of adjacent substrates to define a respective recess 145 between each pair of adjacent substrates. Each of the first substrate 155, the second substrate 160, and the third substrate 165 may include a substrate material 125. For example, the substrate material 125 may include a silicon material.

The sidewalls 120 of the vapor cell 100 may include a substrate material 125 defined by respective substrates (e.g., the first substrate 155, the second substrate 160, the third substrate 165), and the interfacial material 130. The sidewalls 120 of the cavity 110 may be configured such that the substrate material 125 and the interfacial material 130 cooperatively form a recess 145, the surface of the recess 145 inside the cavity 110 being inset relative to the substrate material 125. The substrate material 125 and interfacial material 130 may be formed of, and include, at least one material with specific properties to facilitate chemical processing (e.g., etching). The substrate material 125 may, for example, be selectively etch resistant in comparison to the interfacial material 130 during contemporaneous exposure to an etchant (e.g., hydrofluoric acid (HF)). By way of example only, the substrate material 125 may be selected to include single crystal or polycrystalline silicon or silicon nitride, and the interfacial material 130 may be selected to include silicon oxide. The characteristics of the recesses 145, including but not limited to number, size, shape, height, depth, and lateral circumference of the recesses 145, may be configured to induce the vapor pressure of a subject material 140 in the cavity 110 to be within predetermined thresholds in anticipated operating conditions for the vapor cell 100. The height of the recesses 145 may be defined as the distance along the sidewall 120 that a recess 145 occupies. By way of example, the height of the recesses 145 may be substantially the same as the thickness of interfacial material 130. The depth of the recesses 145 may be defined as the distance the recess 145 is offset relative to the inner cavity 110 surface. By way of example, the depth of the recesses 145 may be substantially the same as the distance between surface of the substrate material 125 facing the cavity 110 and surface of the interfacial material 130 facing the cavity 110. By way of example, the height of a given recess 145 may be between about 20 nm and about 500 nm, and the depth of the recess 145 may be between about 10 μm and about 100 μm. By way of example, the recesses 145 may be sized, shaped, positioned, and configured to contain between about 0.01 μg and about 100 μg of a subject material 140. More specifically, the volume of the recesses 145 may be sized, shaped, positioned, and configured to contain between about 0.25 μg and about 5 μg of a subject material 140.

Regarding FIG. 1A, the interfacial material 130 may be selected such that it may be grown directly on the surface of a wafer or substrate of substrate material 125. By way of example, the interfacial material 130 (e.g., silicon oxide), may result from modification of the substrate surface (e.g., thermal oxidation) or may be controllably grown on the substrate material 125 (e.g., a silicon wafer, a silicon substrate). Growth of the interfacial material 130 on the substrate material 125 may be accomplished by, for example, a vapor deposition process (e.g., chemical vapor deposition or physical vapor deposition). The sidewalls 120 forming the cavity 110 of the vapor cell may be prepared by stacking wafers or substrates on top of one another and bonding the wafers or substrates to one another, with interfacial material 130 between at least some of the wafers or substrates. As a specific, nonlimiting example, the substrate material 125 and interfacial material 130 may be bonded together by means of a contact and anneal bonding process. The sidewall 120 may then include the substrate material 125 and the interfacial material 130, with the interfacial material 130 at least substantially flush with the substrate material 125. The height of the sidewall 120 may include the combination of the height of the substrate material 125 and the height of the interfacial material 130. By way of example, three substrates or wafers of the substrate material 125, each having a respective height of about 500 μm may be utilized. The substrates or wafers of the substrate material 125 may be oxide bonded to each other utilizing the interfacial material 130 (e.g., silicon oxide) as an interfacial material, each instance of the interfacial material 130 having a height of between about 20 nm and about 500 nm. A total height of the stacked structure, including the masses of the substrate material 125 and the masses of the interfacial material 130, may be, for example, between about 1,000 μm and about 2,000 μm (e.g., about 1,500 μm).

Regarding FIG. 1B, the body 105 may include alternating regions of disparate materials, such as, for example, the substrate material 125 (e.g., the substrate material 125 of the first substrate 155, the second substrate 160, epitaxially grown regions of the substrate material 125 interposed between the first substrate 155 and the second substrate 160) and the interfacial material 130 interposed between adjacent regions of the substrate material 125. Each region of the interfacial material 130 may be recessed relative to adjacent regions of the substrate material 125 to define respective recesses 145 between adjacent regions of the substrate material 125. The first substrate 155 may be interposed between the alternating regions of the substrate material 125 and the interfacial material 130 and a first of the windows 115 on a first side of the body 105, and a second substrate 160 may be interposed between the alternating regions of the substrate material 125 and the interfacial material 130 and another of the windows 115 on an opposite side of the body 105. By way of example, the substrate material 125 may include polycrystalline silicon or silicon nitride, and the interfacial material 130 may include silicon oxide. Discrete regions of the substrate material 125 and interfacial material 130 may be, for example, iteratively grown to form portions of the sidewalls 120 of the vapor cell 100. By way of example, each discrete region of the substrate material 125 may have a height of between about 20 nm and about 500 μm.

Recesses 145 in the form of trenches may be formed in the sidewall 120 by, for example, selectively removing portions of the interfacial material 130 facing the cavity 110 to recess the interfacial material 130 relative to the substrate material 125. By way of example only, a series of recesses 145 may be provided in the sidewall 120 by chemical etching (e.g., HF) to remove portions of the interfacial material 130. In some examples, recesses 145 may be formed in the sidewall 120 in such a way as to expose the recesses 145 to the remainder of the cavity 110 by, for example, selectively etching the interfacial material 130. Each resulting recess 145 may have, for example, an at least substantially annular shape, extending around and in fluid communication with a remainder of the cavity 110. By way of example only, the interfacial material 130 (e.g., silicon oxide) may be selectively etched using hydrofluoric acid. The cavity 110 of the body 105 of the vapor cell 100 may be enclosed by adding windows 115 covering the open ends of the cavity and bonding the windows 115 to adjacent regions of the substrate material 125. In embodiments where an array of vapor cells 100 are formed in a wafer, the individual vapor cell 100 may then be singulated from one another, for example, utilizing a dicing saw.

A transparency of the material of the windows 115 may be, for example, about 10% or more within wavelengths of radiation to be directed toward the cavity 110. More specifically, the transparency of the material of the windows 115 may be, for example, between about 10% and about 99%. As a specific, nonlimiting example, the transparency of the material of the windows 115 may be, for example, between about 20% and about 95% (e.g., about 25%, about 50%, about 75%).

In one or more examples, a pore or recess may be introduced into a vapor cell 100 through modification of a material defining the interior vapor cell 100 wall surface. More specifically, a region of at least one of a first substrate or a second substrate partially defining the cavity may include a porous material defining the pore or pores. When a material of a wafer or substrate includes silicon, the silicon material may be rendered porous by, for example, anodization, stain etching, bottom-up synthesis, or other techniques for rendering silicon porous. The regions of the wafer or substrate rendered porous may have a diameter larger or smaller than a diameter of the cavities to be formed or partially formed in the wafer or substrate. Material within the regions of the wafer or substrate rendered porous may be removed (e.g., by drilling, by etching), leaving an annular shaped region of the porous material around each partial cavity formed in the wafer or substrate. The wafer may be bonded to another wafer, before or after formation of the cavities, with the porous region or regions in a specified position and orientation to expose pores to the cavities.

For example, a substrate including the porous regions may be interposed between, and bonded to, two other substrates to form a body with the porous material spaced from the windows by the two other substrates. In some such examples, the porous region may be located proximate to the interface between the first substrate and the second substrate. In some examples, a diameter of the cavity proximate to the region of the porous material may be less than a diameter of the cavity distal from the region of the porous material in order to expose pores on the exposed surfaces normal to the principal axis of the cell. For example, the porous material may be located adjacent or proximate to a window of the vapor cell, and transmission of incident radiation through the window may enable application of incident radiation to the subject material with the cavity, despite a restricted aperture for radiation passing through the window to proceed into the cavity due to the narrower diameter of the substrate having the porous material adjacent or proximate to the window.

FIGS. 2A through 2D are schematic cross-sectional views of vapor cells 200. Each vapor cell 200 may include, for example, a body 205 which defines a cavity 210 within the body 205. For example, the body 205 may include windows 215 forming one or more walls (e.g., boundaries) of the body 205, with the remaining sidewalls 220 being opaque. More specifically, the windows 215 may include, for example, a transparent or translucent borosilicate or aluminosilicate glass material, enabling the cavity 210 of the vapor cell 200 to be viewable through the windows 215.

Figure 2A:
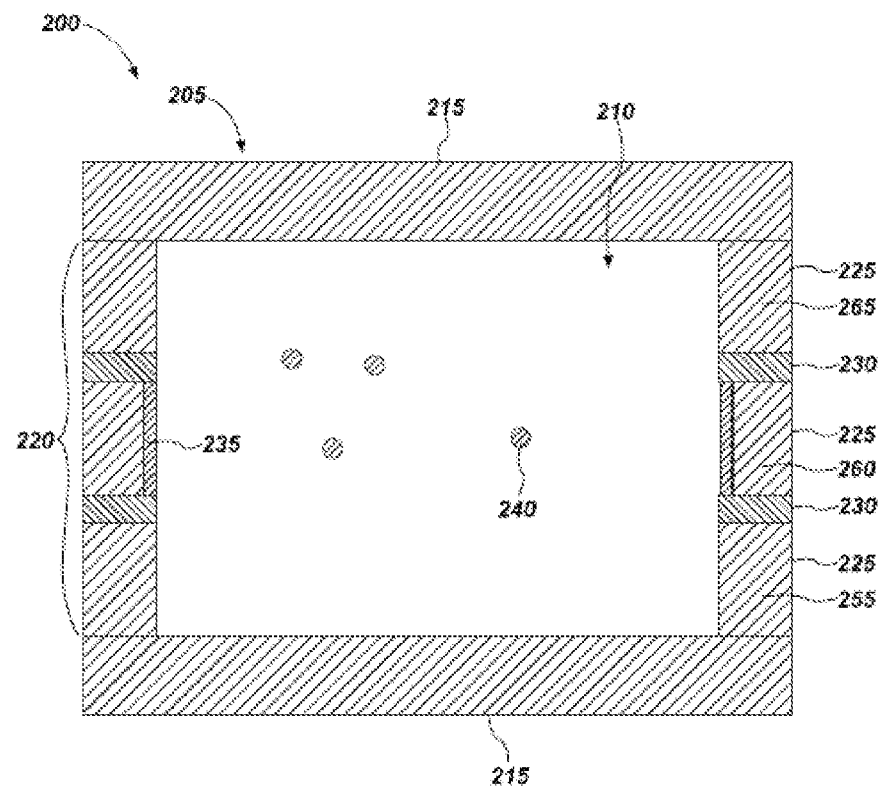
FIGS. 2A, 2B, 2C, and 2D are schematic cross-sectional side views of other examples of vapor cells.

As shown in FIG. 2A, the body 205 may include a first substrate 255 bonded to a second substrate 260 at an interface including an interfacial material 230 interposed between the first substrate 255 and the second substrate 260. At least one of the first substrate 255, the second substrate 260, or the interfacial material 230 between the first substrate 255 and the second substrate 260 may define at least one pore (e.g., a porous volume 235) with a smallest dimension of 500 microns or less. For example, the substrate material 225 of at least a portion of one of the stacked substrates (e.g., the first substrate 255, the second substrate 260, a third substrate 265) may be porous, and the porous portion of the substrate material 225 may be exposed to the cavity 210. More specifically, a region of the second substrate 260 proximate a geometric center of the body 205 between the windows 215 may be porous, and the second substrate 260 may be interposed between, and bonded to, the first substrate 255, at an interface including an interfacial material 230 interposed between the first substrate 255 and the second substrate 260, and bonded to the third substrate 265 to which the windows 215 are respectively bonded, where the bond to the third substrate 265 is at an interface including an interfacial material 230 interposed between the second substrate 260 and the third substrate 265. Each of the first substrate 255, the second substrate 260, and the third substrate 265 may include, and be defined by, a respective mass of a substrate material 225.

The sidewalls 220 of the vapor cell 200 may include the substrate material 225, and an interfacial material 230. By way of example only, the substrate material 225 may include polycrystalline silicon or silicon nitride, and the interfacial material 230 may include silicon oxide. The sidewalls 220 of the cavity 110 may be configured such that at least a portion of the substrate material 225 may be porous, defining a porous volume 235 exposed to and partially defining the cavity 210. By way of example, the substrate material 225 may be rendered porous by anodization, stain etching, bottom-up synthesis, or other techniques for rendering silicon porous in examples where the substrate material 225 includes silicon (e.g., silicon nitride, polycrystalline silicon). Additionally, the interfacial material 230 may also be rendered porous, allowing for the porous volume 235 to be defined in the substrate material 225, the interfacial material 230, or both the substrate material 225 and the interfacial material 230. The characteristics of the porous volume 235, including but not limited to surface area, volume of pores, shape, and average porous diameter of pores, may be configured to induce the vapor pressure of a subject material 240 in the cavity 210 to be within predetermined thresholds in anticipated operating conditions for the vapor cell 200. By way of example, the average diameter of pores within the porous volume 235 may be between about 20 nm and about 500 µm. By way of example, the total volume of pores defined by the porous volume 235 may be sized, shaped, positioned, and configured to contain between about 0.01 µg and about 100 µg of a subject material 240. More specifically, the volume of pores defined by the porous volume 235 may be sized, shaped, positioned, and configured to contain between about 0.25 µg and about 25 µg of a subject material 240.

Regarding FIG. 2A, as an example embodiment, the sidewall 220 of the vapor cell 200 may include three stacked regions of substrate material 225, bonded to one another by regions of interfacial material 230 interposed between adjacent regions of the substrate material 225 to facilitate bonding of the substrate material. In other examples, the three stacked regions of substrate material 225 may be directly bonded to one another without interfacial material 230 interposed between adjacent regions of the substrate material 225. By way of example the substrate material 225 (e.g., the first substrate 255 and the second substrate 260) may be bonded through direct Si—Si bonding in embodiments where one or more interfaces between adjacent substrates of the body 205 (e.g., between the first substrate 255 and the second substrate 260, between the second substrate 260 and the third substrate 265) lacks the interfacial material 230. By way of example only a middle region of substrate material 225 may include a porous volume 235, and overlying and underlying regions of the substrate material 225 may be interposed between the porous volume 235 and the respective windows 215.

Figure 2B:
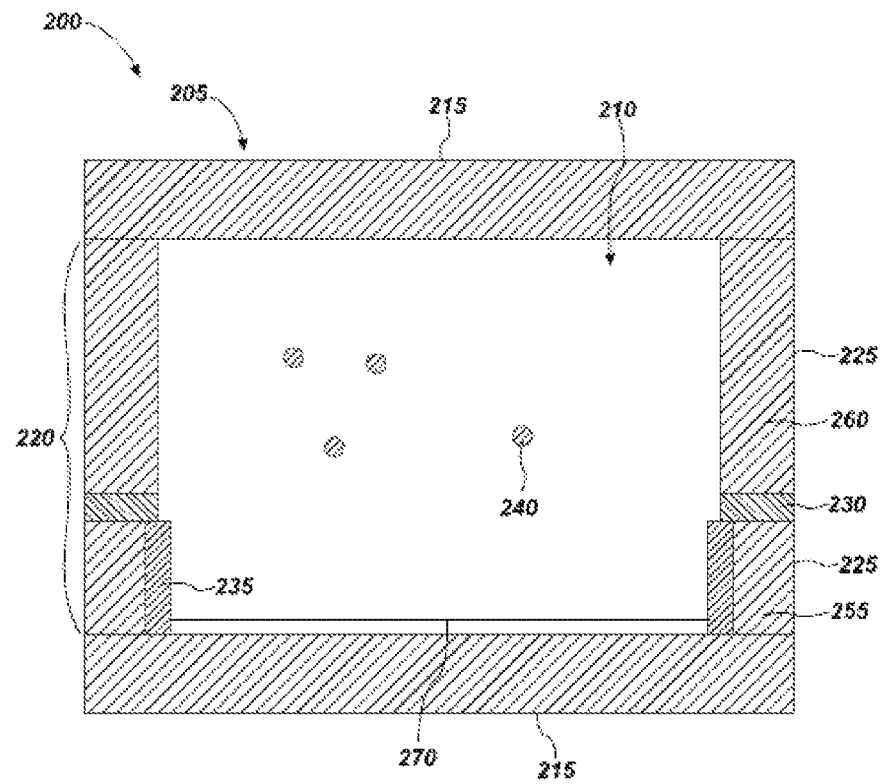

Regarding FIG. 2B, as another example, the body 205 may include stacked substrates, such as, for example, a first substrate 255 and a second substrate 260, bonded to one another at an interface by regions of interfacial material 230 interposed between adjacent regions of the substrate material 225 to facilitate bonding of the substrate material. In another example interfacial material is not provided and first substrate 255 and second substrate 260 are bonded to one another at an interface without interfacial material 230. At least one of the first substrate 255, the second substrate 260, or an interfacial material 230 between the first substrate 255 and the second substrate 260 may define at least one pore having a smallest dimension of 500 microns or less. For example, the first substrate 255, the second substrate 260, or both may include a porous volume 235, a portion of the substrate material 225 of the first substrate 255, the second substrate 260, or both being porous. More specifically, the first substrate 255 proximate to one of the windows 215 may include the porous volume 235, and the porous volume 235 may extend around a circumference of the cavity 210. As a specific, nonlimiting example, the porous volume 235 may occupy an entirety of the surface of the first substrate 255 exposed to the cavity 210. In such an example, an entirety of a thickness of the first substrate 255 may be rendered porous utilizing chemical treatment before material is removed from the porous volume 235 to define a portion of the cavity 210. In some examples, the diameter of the cavity 210 as defined by the first substrate 255 may be smaller than the diameter of the cavity 210 as defined by the second substrate 260. For example, the first substrate 255 may define a restricted aperture 270 proximate to the window 215 through which radiation may be directed toward the subject material 240 within the cavity 210. Each of the first substrate 255 and the second substrate 260 may include, and be defined by, a region of substrate material 225, and a mass of the interfacial material 230 may be interposed between, and bonded to, each adjacent pair of substrates.

The sidewall 220 of the vapor cell 200 may include two stacked regions of substrate material 225, bonded together with a region of interfacial material 230 interposed between the regions of substrate material 225. By way of example only, the two regions of substrate material 225 are displayed as having different heights corresponding to different regions forming different surface areas of the sidewall 220. For example, the height of the region of substrate material 225 including the porous volume 235 may be less than the height of the other region of substrate material 225 not containing the porous volume 235. In some examples, the diameter of the cavity 210 may not be constant. By way of example, the diameter of the cavity 210 defined by the region of the substrate material 225 adjacent to the window 215 through which incident radiation is to be received into the cavity 210, and including the porous volume 235, may be less than the diameter of the cavity 210 defined by the remainder of the substrate material 225. Such a configuration may enable the vapor cell 200 to include a larger porous volume 235 without reducing the ability of incident radiation to interact with subject material within the cavity 210, as beams of radiation may tend to diffuse and expand with distance after passing through the window 215 and beyond the region of substrate material 225 having the smaller diameter.

Figure 2C:
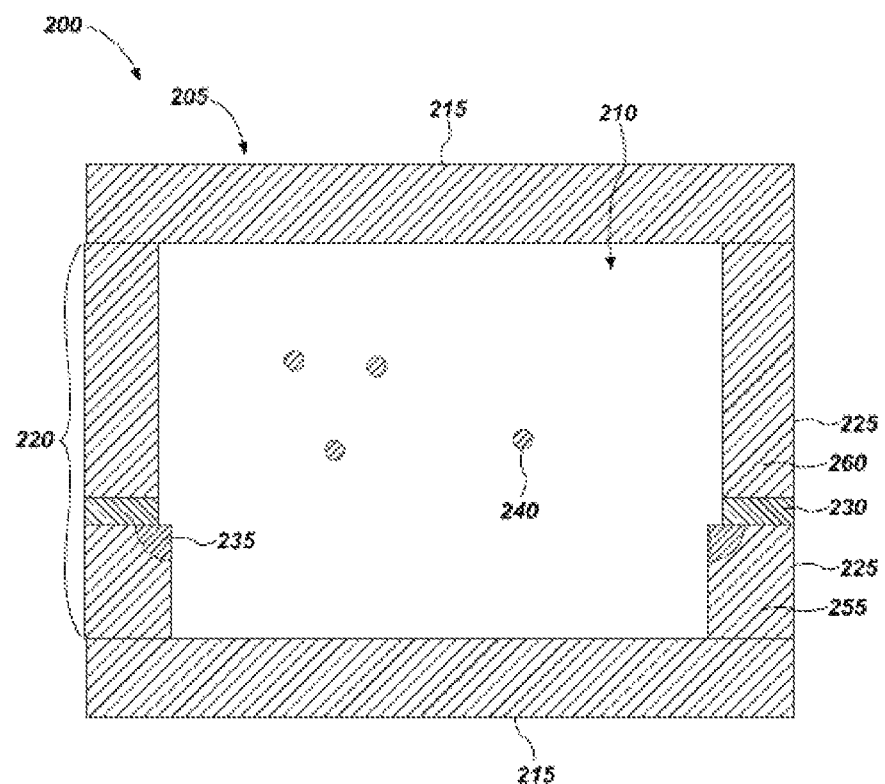

Regarding FIG. 2C, as another example, the body 205 may include stacked substrates, such as, for example, a first substrate 255 and a second substrate 260, bonded to one another an interface. At least one of the first substrate 255, the second substrate 260, or an interfacial material 230 between the first substrate 255 and the second substrate 260 may define at least one pore having a smallest dimension of 500 microns or less. For example, the first substrate 255, the second substrate 260, or both may include a porous volume 235, a portion of the substrate material 225 of the first substrate 255, the second substrate 260, or both being porous. More specifically, the first substrate 255 proximate to one of the windows 215 may include the porous volume 235, and the porous volume 235 may extend around a circumference of the cavity 210. As a specific, nonlimiting example, the porous volume 235 may occupy only a portion of the surface of the first substrate 255 exposed to the cavity 210, a remainder of the surface of the first substrate 255 exposed to the cavity 210 being nonporous. In such an example, only a portion of a thickness of the first substrate 255 may be rendered porous before material is removed from the porous volume 235 and the remainder of the first substrate 255 to define a portion of the cavity 210. In some examples, the diameter of the cavity 210 as defined by the first substrate 255 may be smaller than the diameter of the cavity 210 as defined by the second substrate 260. Each of the first substrate 255 and the second substrate 260 may include a substrate material 225, and a mass of the interfacial material 230 may be interposed between, and bonded to, each adjacent pair of substrates.

One of the regions of substrate material 225 may include a porous volume 235 occupying only a portion of the surface of the region of substrate material 225 defining the cavity 210. A remainder of the region of substrate material 225 defining the cavity 210 may be nonporous. For example, the porous volume 235 may be spaced from the window 215, with the remainder of the region of substrate material 225 interposed between the porous volume 235 and the window 215 being nonporous. The porous volume 235 may also have a depth that is not constant within the region of the substrate material 225, as measured relative to the surface of the substrate material 225 with the interfacial material 230. For example, the depth of the porous volume 235 may be greatest proximate to the interfacial material 230 and may decrease nonlinearly as distance from the interfacial material 230 increases. In another example, the depth of the porous volume 235 may be greatest proximate to the interfacial material 230 and may decrease linearly as distance from the interfacial material 230 increases.

The cross sectional profile of the porous volume 235 may be at least partially defined by the method through which it was prepared. By way of example, the selected region for the porous volume 235 may be prepared by creating a patterned hard mask (e.g., silicon carbide) over a surface of the region of substrate material 225. Exposed portions of the substrate material 225 may be rendered porous by, for example, anodization, stain etching, bottom-up synthesis, or other techniques for rendering silicon porous. With some such techniques, a depth of the porous volume 235 may be at its maximum proximate to the cavity 210, and may taper to a minimum depth distal from the cavity 210 (e.g., proximate to the edges of the mask used when rendering the substrate material 225 porous). In some examples, the cross-sectional shape of the porous volume 235 having a non-constant depth may include an at least substantially arcuate portion (e.g., a quarter-circular cross-sectional shape).

In some examples, a porous volume 235 may be rendered into multiple separate substrate material 225 segments. For example, two substrate material 225 segments may be bonded together with an interfacial material 230 interposed between the two substrate material 225 segments. Each substrate material 225 may be rendered to have a region within the cavity to include a respective porous volume 235. The porous volume 235 may cover the entire surface, or a portion of the surface within the cavity 210 of the substrate material 225. Such a configuration may provide a concentrated region at which the porous volume 235 is concentrated proximate to, or distal from, the bonding interface.

Figure 2D:
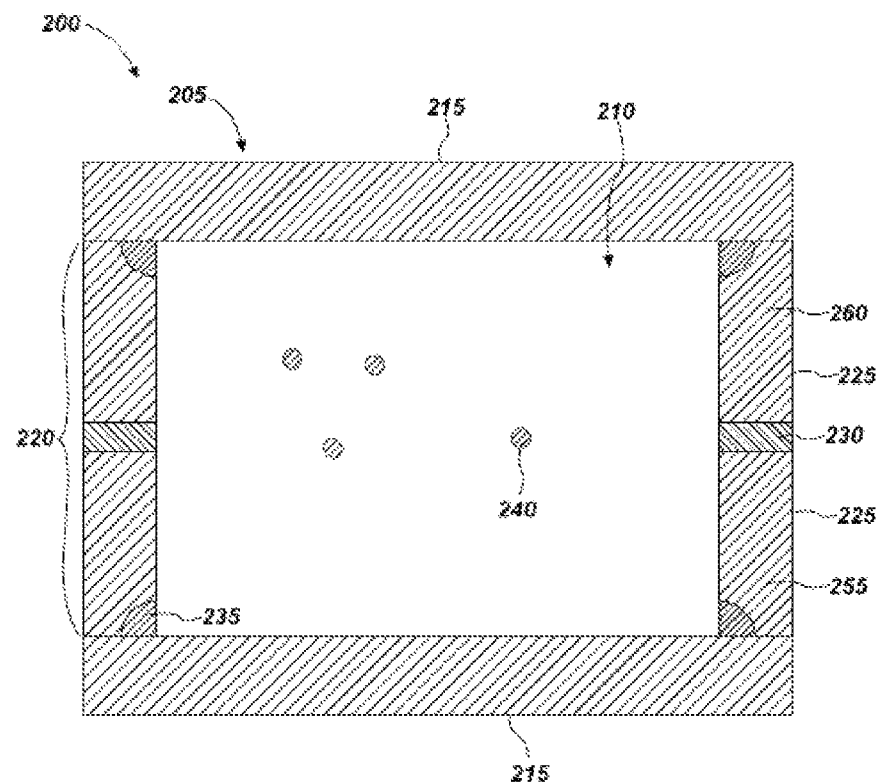

Regarding FIG. 2D, as another example, the body 205 may include stacked substrates, such as, for example, a first substrate 255 and a second substrate 260, bonded to one another an interface. At least one of the first substrate 255, the second substrate 260, or an interfacial material 230 between the first substrate 255 and the second substrate 260 may define at least one pore having a smallest dimension of 500 microns or less. For example, the first substrate 255, the second substrate 260, or both may include a porous volume 235, a portion of the substrate material 225 of the first substrate 255, the second substrate 260, or both being porous. More specifically, each of the first substrate 255 and the second substrate 260 may include a respective porous volume 235, and the porous volume 235 may extend around a circumference of the cavity 210. As a specific, nonlimiting example, a first porous volume 235 may occupy only a portion of the surface of the first substrate 255 exposed to the cavity 210, a remainder of the surface of the first substrate 255 exposed to the cavity 210 being nonporous, and a second porous volume 235 may occupy only a portion of the surface of the second substrate 260 exposed to the cavity 210, a remainder of the surface of the second substrate 260 exposed to the cavity 210 being nonporous. In such an example, only a portion of a thickness of the substrate material 225 of the first substrate 255 and the second substrate 260 may be rendered porous before material is removed from the porous volume 235 and the remainder of the first substrate 255 and the second substrate 260 to define a portion of the cavity 210. The porous volumes 235 may be located, for example, adjacent to the windows 215 on opposite sides of the stacked first substrate 255 and second substrate 260. As another example, the porous volumes 235 may be located proximate to the interfacial material 230 interposed between, and bonded to, the first substrate 255 and the second substrate 260. Each of the first substrate 255 and the second substrate 260 may include a substrate material 225, and a mass of the interfacial material 230 may be interposed between, and bonded to, each adjacent pair of substrates.

Each discrete region of the substrate material 225 may include a respective porous volume 235. For example, each of the regions of substrate material 225 may include a porous volume 235 occupying only a portion of the surface of the respective region of substrate material 225 defining the cavity 210. A remainder of the region of substrate material 225 defining the cavity 210 may be nonporous. For example, at least one porous volume 235 may be located proximate (e.g., adjacent) to the window 215, with the remainder of the region of substrate material 225 interposed between the porous volume 235 and the interfacial material 230 being nonporous. More specifically, each porous volume 235 may be located proximate (e.g., adjacent) to a respective one of the windows 215, with the remainder of the corresponding region of substrate material 225 interposed between the porous volume 235 and the interfacial material 230 being nonporous.

Figure 3A:
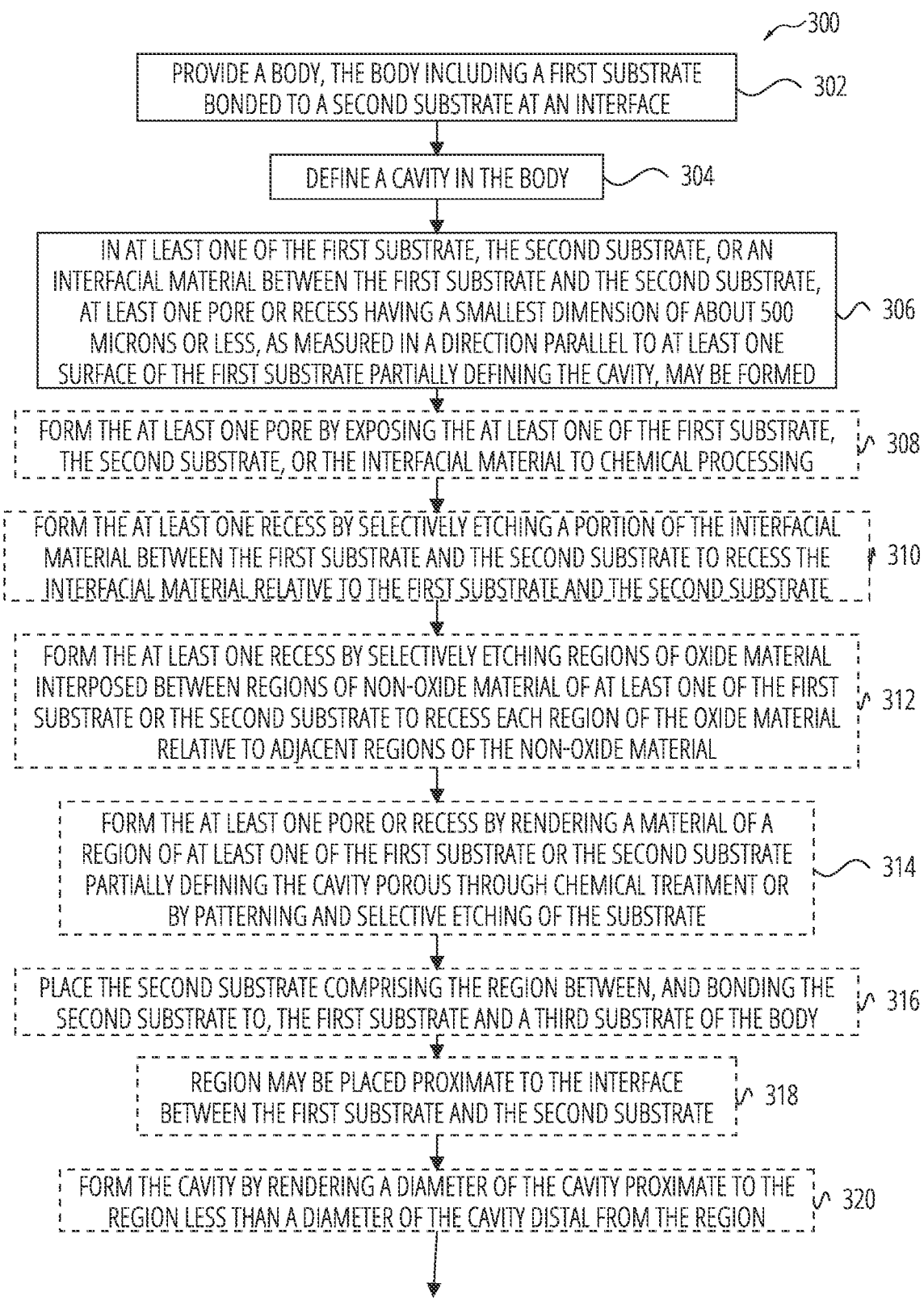
FIGS. 3A and 3B are flowcharts depicting illustrative methods of making a vapor cell.
Figure 3B:
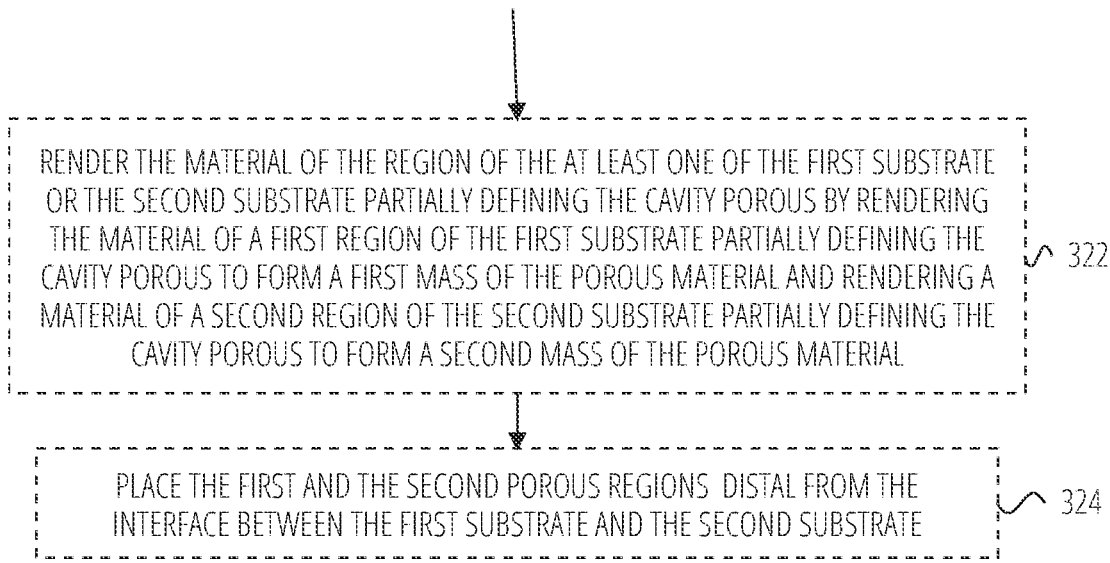

FIGS. 3A and 3B show a flowchart depicting an illustrative method 300 of making a vapor cell. As specific, non-limiting examples, the body of the vapor cell may take any of the forms, and may include any of the materials, described previously in connection with FIGS. 1A, 1B, 2A, 2B, 2C, and 2D.

Referring to FIG. 3, the method 300 may involve providing a body, the body including a first substrate bonded to a second substrate at an interface, as indicated at act 302. A cavity may be defined within the body, as indicated at act 304. In at least one of the first substrate, the second substrate, or an interfacial material between the first substrate and the second substrate, at least one pore or recess having a smallest dimension of about 500 microns or less, as measured in a direction parallel to at least one surface of the first substrate partially defining the cavity, may be formed, as indicated at act 306.

In some examples, forming the at least one pore or recess may involve forming the at least one pore by exposing the at least one of the first substrate, the second substrate, or the interfacial material to chemical processing, as indicated at act 308. In some examples, forming the at least one pore or recess may involve forming the at least one recess by selectively etching a portion of the interfacial material between the first substrate and the second substrate to recess the interfacial material relative to the first substrate and the second substrate, as indicated at act 310. In some examples, forming the at least one pore or recess comprises forming the at least one recess by selectively etching regions of oxide material interposed between regions of non-oxide material of at least one of the first substrate or the second substrate to recess each region of the oxide material relative to adjacent regions of the non-oxide material, as indicated at act 312. In some examples, forming the at least one pore or recess may involve rendering a material of a region of at least one of the first substrate or the second substrate partially defining the cavity porous through chemical treatment or by patterning and selective etching of the substrate, as indicated at act 314.

In some examples, the method 300 may involve placing the second substrate comprising the region between, and bonding the second substrate to, the first substrate and a third substrate of the body, as indicated at act 316. In some examples, the region may be placed proximate to the interface between the first substrate and the second substrate, as indicated at act 318. In some examples, forming the cavity may involve rendering a diameter of the cavity proximate to the region less than a diameter of the cavity distal from the region, as indicated at act 320. In some examples, rendering the material of the region of the at least one of the first substrate or the second substrate partially defining the cavity porous may involve rendering the material of a first region of the first substrate partially defining the cavity porous to form a first mass of the porous material and rendering a material of a second region of the second substrate partially defining the cavity porous to form a second mass of the porous material, as indicated at act 322. In some examples, the first and the second porous regions may be placed distal from the interface between the first substrate and the second substrate, as indicated at act 324.

The ordering and arrows of the acts in the flowchart of FIGS. 3A and 3B are not to be interpreted to imply that those acts must or should be performed in a specific order. When it is logically possible to do so, the acts in the flowchart of FIGS. 3A and 3B may be performed in any order. For example, the cavity may be defined in the body, as stated in act 304, before the body is provided (i.e., when the cavity has been preformed as part of the body), after the formation of at least one pore or recess, or before or after any of acts 308 through 324. In addition, the dashed lines indicating acts 308 through 324 are optional in some examples should not be interpreted to mean that any of acts 302, 304, or 306, or the order in which they are presented, is not optional.

Figure 4A:
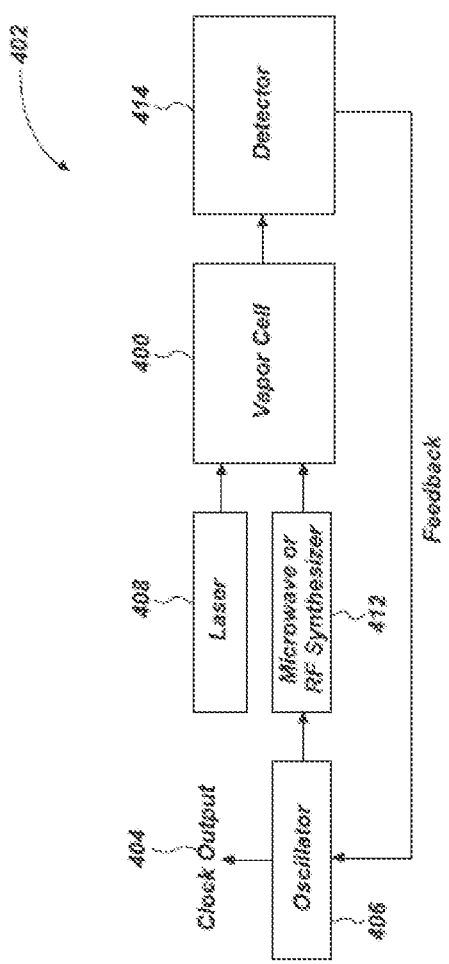
FIGS. 4A and 4B are schematics of illustrative systems including a vapor cell in accordance with this disclosure.
Figure 4B:
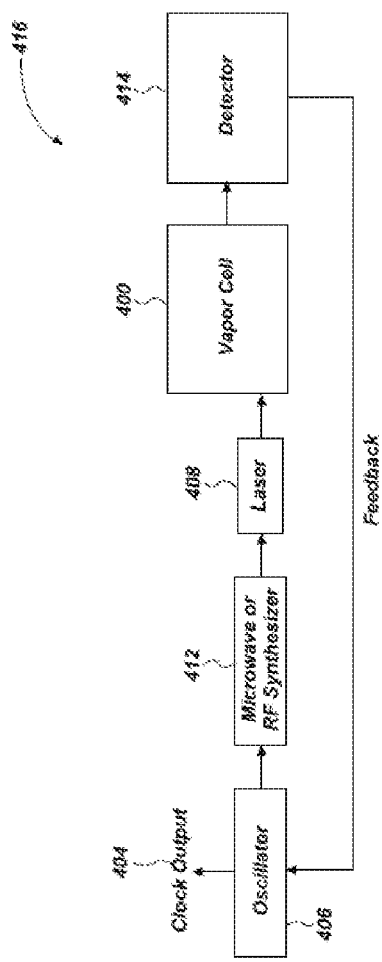

FIGS. 4A and 4B are schematics of illustrative systems 402 and 416, respectively, including a vapor cell 400 in accordance with this disclosure, differing in whether microwaves are applied directly to the vapor cell 400, as in a microwave-optical double-resonance clock or an Mx magnetometer shown in system 402, or applied as modulation to a laser bias current, as in a clock based on coherent population trapping or a Bell-Bloom type magnetometer shown in system 416. The systems 402 and 416 may be configured as, for example, atomic clocks, magnetometers, or gyroscopes.

The vapor cell 400 may include an examination region containing vaporized atoms of the subject material, and one or more emitters may be configured to direct electromagnetic radiation of a known type and intensity toward the examination region (e.g., one or more lasers 408, microwaves 412, both lasers 408 and microwaves 412, without limitation). Such a vapor cell 400 may be maintained at near-vacuum pressure or may include a buffer gas. By way of example only, the buffer gas may include a mixture of $N_2$ and argon. A detector 414 may include a sensor configured to detect the transmitted radiation and therefore determine one or more properties of the vaporized atoms of the subject material in response to the transmitted radiation. For example, the sensor of the detector 414 may be configured to detect the transition of electrons of the subject material between energy levels, responsive to the energy from a first of the emitters (e.g., from the laser 408), as measured in variation of signal strengths relative to the spectrum of the radiation, e.g., from the microwave 412.

One or more signals representative of the properties measured by the detector 414 may be provided as feedback to an oscillator 406. The oscillator 406 may be used to generate a clock output 404, which may be used as a clock signal itself or may be used to verify or synchronize another clock signal. In other words, the oscillator 406 may generate a clock output 404 whose frequency is determined by energy level differences in the subject material.

Providing recesses or pores in a body of a vapor cell may induce one or more exposed surfaces of a subject liquid within the vapor cell to exhibit a concave shape. As a nonlimiting example, the size, shape, position, and configuration of the recesses or pores may have capillary-like characteristics, causing any subject material condensed within the recesses or pores to have a negative meniscus. In accordance with the Kelvin equation, the concave shape of the exposed surfaces of the masses of subject material may cause the vapor pressure to be less than the saturation pressure for the subject material above a flat liquid surface. Such control over the vapor pressure may enable devices utilizing the vapor cells, such as, for example, atomic clocks, to operate reliably over a greater range of operating temperatures.

Such a system 402 or 416 may be particularly useful for generating, verifying, or synchronizing clock signals of high accuracy and/or in extreme environmental conditions. Systems 402 and 416 in accordance with this disclosure may find application in the aerospace industry (e.g., to control clock signals in satellites and spacecraft), the automotive industry, the telecommunications and banking industries (e.g., to verify or set clock signals for relevant computing systems), and in standard-setting situations (e.g., to establish timings for relevant standards). By reducing the vapor pressure of the subject material in the vapor cell of the system 402 or 416, the atomic clock may operate over a larger range of ambient temperatures.

Techniques for forming recesses and/or pores, as disclosed herein, may enable formation of recesses and/or pores having selectable sizes, shapes, volumes, and positions in vapor cells. Such techniques may enable selection and variation in the volume of subject material receivable by the recesses and/or pores, and accompanying flexibility in size of the vapor cell, quantity of subject material in the cavity of the vapor cell, and operating parameters for vapor cells.

While certain illustrative examples have been described in connection with the figures, the scope of this disclosure is not limited to those examples explicitly shown and described in this disclosure. Rather, many additions, deletions, and modifications to the examples described in this disclosure may be made to produce examples within the scope of this disclosure, such as those specifically claimed, including legal equivalents. In addition, features from one disclosed example may be combined with features of another disclosed example while still being within the scope of this disclosure.

What is claimed is:

1. A vapor cell, comprising:
a body defining a cavity within the body, the body comprising a first substrate bonded to a second substrate at an interface, a first window located on a side of the first substrate opposite the second substrate, and a second window located on a side of the second substrate opposite the first substrate; and
at least one of the first substrate, the second substrate, or an interfacial material between the first substrate and the second substrate, defining at least one recess or pore, a smallest dimension of the at least one recess or pore being about 500 microns or less, as measured in a direction parallel to at least one surface of the first substrate partially defining the cavity, the at least one recess or pore distanced from the first window and the second window.

2. The vapor cell of claim 1, wherein:
the interfacial material comprises an oxide material interposed between the first substrate and the second substrate; and
the interfacial material is recessed relative to the first substrate and the second substrate to define the at least one recess between the first substrate and the second substrate, the first substrate, the interfacial material, and the second substrate cooperatively defining the at least one recess.

3. The vapor cell of claim 2, wherein the body comprises a stack of substrates comprising at least the first substrate and the second substrate and a respective mass of the interfacial material interposed between each pair of substrates of the stack of substrates, wherein at least one mass of the interfacial material is recessed relative to each pair of substrates between which it is interposed define a series of recesses comprising the at least one recess.

4. The vapor cell of claim 1, wherein the first substrate comprises a first silicon material, the second substrate comprises a second silicon material, and the interfacial material comprises a silicon oxide material.

5. The vapor cell of claim 1, wherein the body comprises the at least one recess and the body comprises alternating regions of disparate materials, the disparate materials comprising the interfacial material and a substrate material of the first substrate, the second substrate, or epitaxially grown, each region of the interfacial material of the disparate materials recessed relative to adjacent regions of the substrate material of the disparate materials to define the at least one recess between the adjacent regions of the substrate material.

6. The vapor cell of claim 5, wherein the interfacial material comprises an oxide material and the substrate material comprises a non-oxide material.

7. The vapor cell of claim 1, wherein a region of at least one of the first substrate or the second substrate partially defining the cavity comprises a porous material.

8. The vapor cell of claim 7, wherein the region is of the second substrate, and wherein the second substrate is interposed between, and bonded to, the first substrate and a third substrate of the body.

9. The vapor cell of claim 7, wherein the region is located proximate to the interface between the first substrate and the second substrate.

10. The vapor cell of claim 9, wherein a diameter of the cavity proximate to the region is less than a diameter of the cavity distal from the region.

11. The vapor cell of claim 7, wherein the body comprises a stack of substrates comprising at least the first substrate and the second substrate, a first region of the first substrate partially defining the cavity comprises a first mass of the porous material, and a second region of the second substrate partially defining the cavity comprises a second mass of the porous material.

12. The vapor cell of claim 11, wherein the first region and the second region are located distal from an interface between the first substrate and the second substrate.

13. A method of making a vapor cell, comprising:
providing a body, the body comprising a first substrate bonded to a second substrate at an interface, a first window located on a side of the first substrate opposite the second substrate, and a second window located on a side of the second substrate opposite the first substrate;
defining a cavity within the body; and
forming, in at least one of the first substrate, the second substrate, or an interfacial material between the first substrate and the second substrate, at least one pore or recess having a smallest dimension of about 500 microns or less, as measured in a direction parallel to at least one surface of the first substrate partially defining the cavity, the at least one recess or pore distanced from the first window and the second window.

14. The method of making a vapor cell of claim 13, wherein forming the at least one pore or recess comprises forming the at least one pore by exposing the at least one of the first substrate, the second substrate, or the interfacial material to chemical processing.

15. The method of claim 13, wherein forming the at least one pore or recess comprises forming the at least one recess by selectively etching a portion of the interfacial material between the first substrate and the second substrate to recess the interfacial material relative to the first substrate and the second substrate.

16. The method of claim 13, wherein forming the at least one pore or recess comprises forming the at least one recess by selectively etching regions of oxide material interposed between regions of non-oxide material of at least one of the first substrate or the second substrate to recess each region of the oxide material relative to adjacent regions of the non-oxide material.

17. The method of claim 13, wherein forming the at least one pore or recess comprises rendering a material of a region of at least one of the first substrate or the second substrate partially defining the cavity porous through chemical treatment or by patterning and selective etching of the substrate.

18. The method of claim 17, comprising placing the second substrate comprising the region between, and bonding the second substrate to, the first substrate and a third substrate of the body.

19. The method of claim 18, comprising placing the region proximate to the interface between the first substrate and the second substrate.

20. The method of claim 19, wherein defining the cavity comprises rendering a diameter of the cavity proximate to the region less than a diameter of the cavity distal from the region.

21. The method of claim 17, wherein rendering the material of the region of the at least one of the first substrate or the second substrate partially defining the cavity porous comprises rendering the material of a first region of the first substrate partially defining the cavity porous to form a first mass of the porous material and rendering a material of a second region of the second substrate partially defining the cavity porous to form a second mass of the porous material.

22. The method of claim 21, comprising placing the first and the second porous regions distal from the interface between the first substrate and the second substrate.

23. A system, comprising:
- an emitter positioned and oriented to direct radiation through windows of a vapor cell; and
- a detector positioned and oriented to detect the radiation;
- wherein the vapor cell comprises a body defining a cavity within the body, the body comprising:
  - a first substrate bonded to a second substrate at an interface;
  - a first window located on a side of the first substrate opposite the second substrate; and
  - a second window located on a side of the second substrate opposite the first substrate,
  - wherein at least one of the first substrate, the second substrate, or an interfacial material between the first substrate and the second substrate defines at least one pore or recess having a smallest dimension of about 500 microns or less, as measured in a direction parallel to at least one surface of the first substrate partially defining the cavity, the at least one recess or pore distanced from the first window and the second window.

* * * * *